(12) United States Patent
Tzeng et al.

(10) Patent No.: US 6,620,679 B1
(45) Date of Patent: Sep. 16, 2003

(54) METHOD TO INTEGRATE HIGH PERFORMANCE 1T RAM IN A CMOS PROCESS USING ASYMMETRIC STRUCTURE

(75) Inventors: Kuo-Chyuan Tzeng, Hsin-Chu (TW); Chen-Jong Wang, Hsin-Chu (TW); Dennis J. Sinitsky, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/224,185

(22) Filed: Aug. 20, 2002

(51) Int. Cl.$^7$ ............................................. H01L 21/8242
(52) U.S. Cl. ...................... 438/250; 438/262; 438/266; 438/302; 438/525
(58) Field of Search ................................. 257/296–312; 438/250, 253, 262, 266, 275, 302, 525

(56) References Cited

U.S. PATENT DOCUMENTS

| 5,510,284 A | 4/1996 | Yamauchi .................... 437/43 |
| 5,844,271 A | 12/1998 | Sethi et al. ................. 257/318 |
| 5,918,148 A | 6/1999 | Sato ............................ 438/669 |
| 6,316,320 B1 | 11/2001 | Nakahata et al. ........... 438/300 |

*Primary Examiner*—Kamand Cuneo
*Assistant Examiner*—Asok Kumar Sarkar
(74) *Attorney, Agent, or Firm*—George O. Saile; Stephen B. Ackerman; Stephen G. Stanton

(57) ABSTRACT

A high performance 1T RAM cell in a system-on-a-chip is formed using an asymmetric LDD structure that improves pass gate performance and storage node junction leakage. The asymmetric LDD structure is formed using selective ion implantation of the core and I/O LDDs. The node junctions are both pocket implant-free and source/drain implant-free. Further, silicide formation is avoided within the storage node junctions by forming nearly merged sidewall spacers within the node junctions and by forming optional blocking portions over the nearly merged sidewall spacers.

89 Claims, 5 Drawing Sheets

METHOD TO INTEGRATE HIGH PERFORMANCE 1T RAM IN A CMOS PROCESS USING ASYMMETRIC STRUCTURE

FIELD OF THE INVENTION

The present invention relates generally to semiconductor fabrication and more specifically to fabrication of 1T RAM structures.

BACKGROUND OF THE INVENTION

Integration of memory in system-on-a-chips (SOC) is complicated due to the incompatibility of the memory process to the logic process. A 1T random access memory (RAM) structure was announced to alleviate the problem of process incompatibility. The 1T RAM structure consists of a metal-oxide semiconductor (MOS) transistor and a planar capacitor.

U.S. Pat. No. 5,510,284 to Yamauchi describes a process to form an asymmetric non-volatile memory.

U.S. Pat. No. 5,844,271 to Sethi et al. describes a gate with asymmetric source/drain regions.

U.S. Pat. No. 5,918,148 to Sato describes a 1T RAM process.

U.S. Pat. No. 6,316,320 to Nakahata et al. describes a 1T and one capacitor memory device.

SUMMARY OF THE INVENTION

Accordingly, it is an object of one or more embodiments of the present invention to provide an improved method of integrating a 1T RAM in a CMOS process.

Other objects will appear hereinafter.

It has now been discovered that the above and other objects of the present invention may be accomplished in the following manner. Specifically, a substrate having a core area, a 1T RAM cell area and an I/O area is provided. A first poly gate is formed over the substrate within the core area with the first poly gate having exposed side walls. Respective pairs of capacitor plates and adjacent word lines are formed over the substrate within the 1T RAM cell area to form node junctions between the respective capacitor plates and adjacent word lines and a bit line contact junction between the word lines. The capacitor plates and the word lines each having exposed side walls. A second poly gate is formed over the substrate within the I/O area with the second poly gate having exposed side walls. First patterned masks are formed over the substrate to expose: the core area; the bit line contact junction; and portions of the node junctions adjacent the word lines. A first implantation is performed. A tilt implantation is performed. The first patterned masks are removed. Second patterned masks are formed over the substrate to expose: the I/O area and the 1T RAM cell area not within the bit line contact junction. A second implantation is performed. Sidewall spacers are formed so that the adjacent sidewall spacers between the respective pairs of capacitor plates and word lines being nearly merged. A third implantation is performed.

BRIEF DESCRIPTION OF THE DRAWINGS

The present invention will be more clearly understood from the following description taken in conjuction with the accompanying drawings in which like reference numerals designate similar or corresponding elements, regions and portions and in which.

DETAILED DESCRIPTION OF THE PREFERRED EMBODIMENT

The method of the present invention forms an asymmetric lightly-doped drain (LDD) structure for improving pass gate performance and storage node (SN) junction leakage. The asymmetric LDD structure for the one transistor (1T) RAM cell transistor and junction can be achieved by using selective ion implantation of the core and input-output (I/O) N-wells.

A core PLDD mask is used to open pass gate, bit line contact and a portion of the storage node area within the 1T RAM region and the core region. In the 1T RAM region, all open areas can receive PLDD implant dosage but only the bit line contact area can receive the pocket implant due to the shadowing effect of a large tilt angle ion implantation.

An I/O PLDD mask is used to block the core region and pass gate area in the 1T RAM region. Within the 1T RAM region, all the area except the bit line contact area can receive an I/O PLDD implant dosage.

"PLDD" is a P-type low doped drain implant for PMOSFET where the P-type implant may be boron (B) or $BF_2$, for example. A core PLDD implant contains: PLDD ion implant P-type dosage; and a pocket implant (with tilt angle of rotation) that is an N-type dosage for pocket implants. An I/O PLDD contains PLDD only.

After sidewall spacer formation on the side walls of the gates, capacitor plates and word lines, the sidewall spacers on the capacitor plates and word lines facing each other in the storage node areas almost merge to block the P-S/D implant dosage within the storage node areas and thus prevents formation of heavy $P^+$ implants in those areas.

Thus, a high performance 1T RAM with an asymmetric LDD structure can be fabricated and further, lightly doped storage node junctions without $P^+$ S/D implants or pocket implants can be fabricated. A resist protect oxide (RPO) layer may also be formed over the almost merged sidewall spacers in the storage node areas to prevent silicide formation there. A non-silicide storage node junction can further improve storage node junction leakage.

Initial Structure

Figure 1:
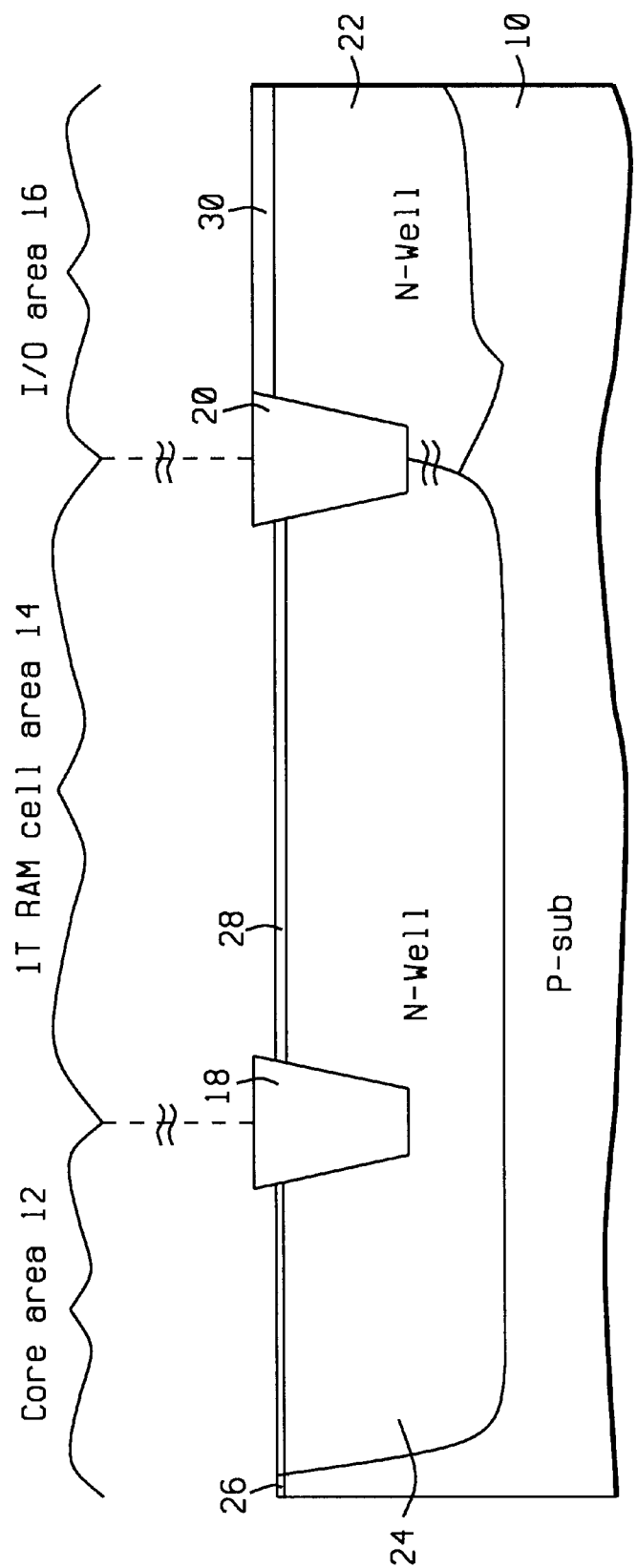
FIGS. 1 to 5 schematically illustrate a preferred embodiment of the present invention.

As shown in FIG. 1, substrate 10 is divided into a central 1T RAM cell area 14 bookended by a core area 12 and an I/O area 16 and separated by respective shallow trench isolation (STI) structures 18, 20.

An I/O N-well is formed within substrate 10 within the I/O area 16 and a core N-well is formed in the substrate 10 within the core area 12 and the 1T RAM cell area 14. Substrate 10 is preferably a P-substrate.

A triple-thick oxide layer is formed over the surface of the substrate 10 where the thinnest gate oxide layer 26 is formed within the core area 12, the middle thickness gate oxide layer 28 is formed within the 1T RAM cell area 14 and the thickness gate oxide layer 30 is formed within the I/O area 16. The thinnest gate oxide layer 26 is preferably less than about 20 Å thick and more preferably from about 15 to 20 Å thick. The middle thickness gate oxide layer 28 is preferably from about 20 to 32 Å thick and more preferably from about 24 to 28 Å thick. The thickest gate oxide layer 30 is preferably greater than about 32 Å thick, is more preferably from about 32 to 120 Å thick and is most preferably from about 50 to 70 Å thick.

Patterning of Polysilicon Layer to Form Poly Gates, Plates and Word Lines

Figure 2:
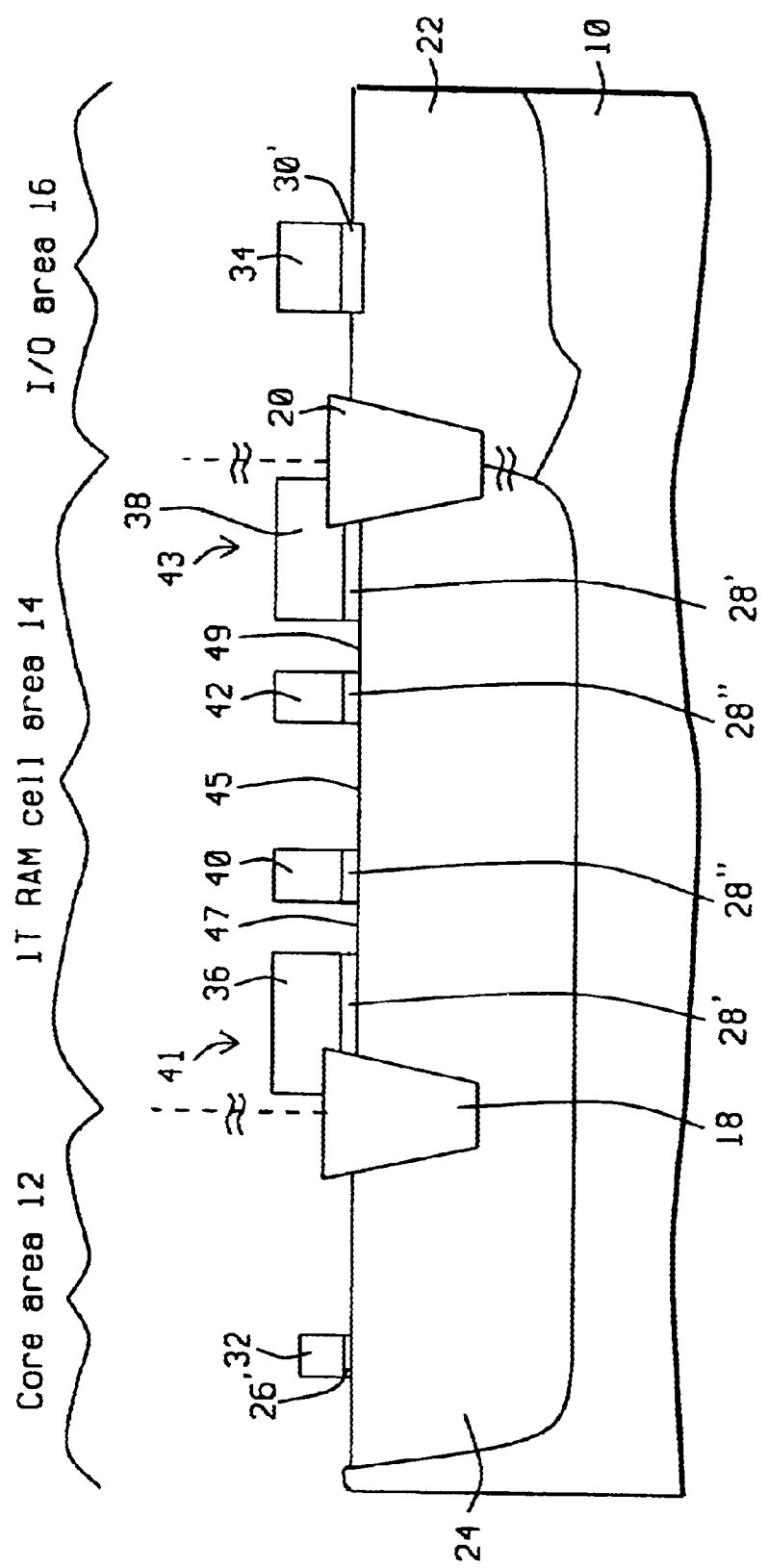

As shown in FIG. 2, a layer of polysilicon having a thickness of preferably from about 1500 to 2500 Å and more preferably from about 1800 to 2000 Å is formed over the triple gate oxide layers 26, 28, 30 and, with the respective triple gate oxide layers 26, 28, 30, is patterned to form, for example:

a) a poly gate 32 with an underlying patterned thinnest gate oxide portion 26' within the core area 12 where poly gate 32 is a core poly gate;

b) a poly gate 34 with an underlying patterned thickest gate oxide portion 30' within the I/O area 16 where poly gate 34 is an I/O poly gate;

c) a respective pair of capacitor plates 36, 38 with underlying respective patterned middle thickness gate oxide portions 28' to form capacitors 41, 43 within 1T RAM cell area 14 partially overlying STI structures 18, 20; and d) a respective pair of word lines, or pass gate of 1T RAM, 40, 42 with underlying respective patterned middle thickness gate oxide portions 28" within 1T RAM cell area 14 and inboard of plates 36, 38.

Node junction 47 is situated between plate 36 and word line 40 and node junction 49 is situated between plate 38 and word line 42. Bit line contact area/junction 45 is situated between word lines 40 and 42. It is noted that junction formation is done after the core I/O LDD implant.

Core LDD Implants 54, 56, 58 and Pocket Implant 60

Figure 3:
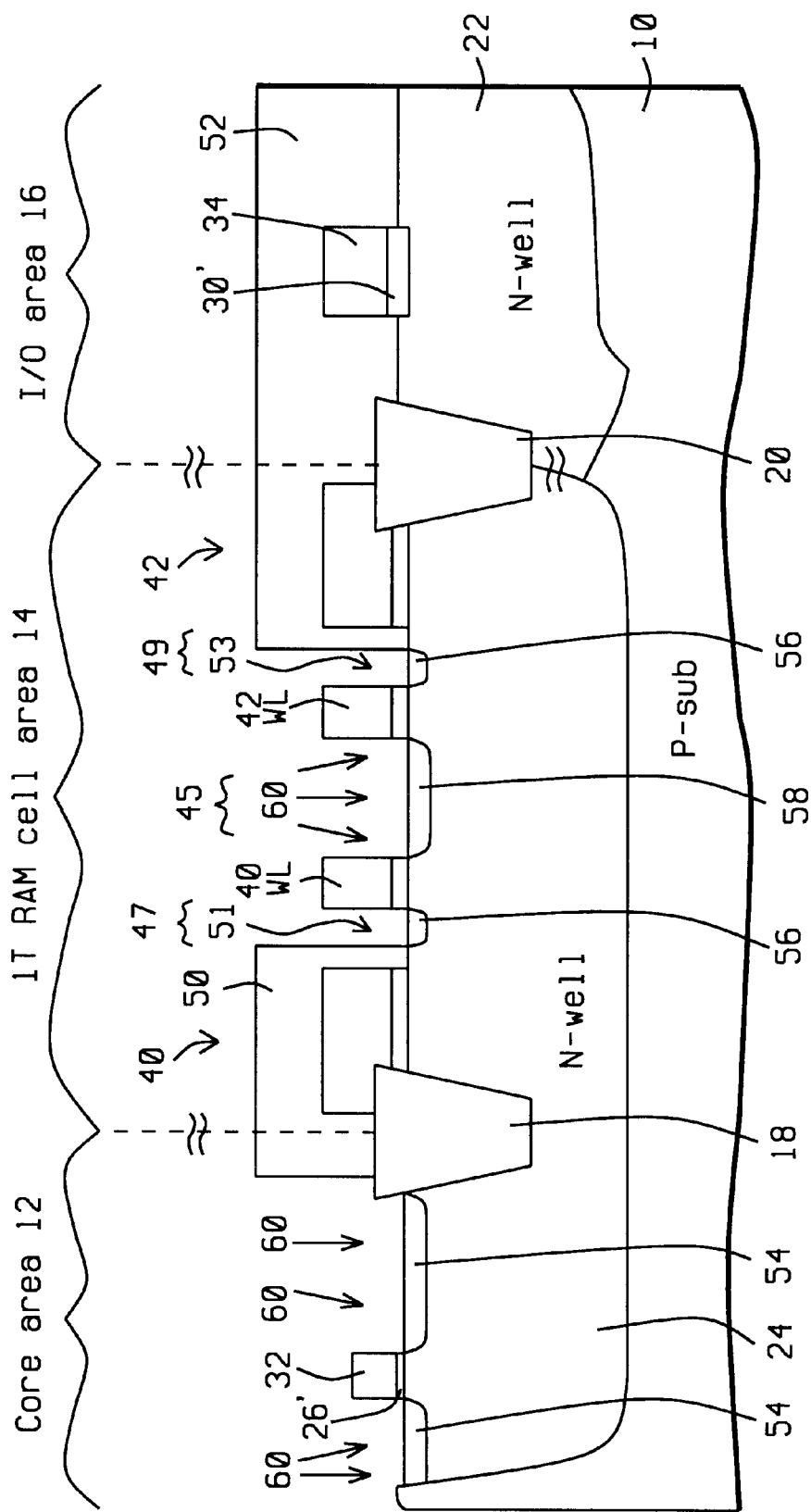

As shown in FIG. 3, core PLDD masks 50, 52 are formed over the structure to expose only:

a) core area 12 including poly gate/core poly gate 32;

b) bit line contact area/junction 45 within the 1T RAM cell area 14; and c) portions 51, 53 within the respective node junctions 47, 49.

The exposed portions 51, 53 of respective node junctions 47, 49 each have a width of preferably from about 900 to 2000 Å and more preferably from about 900 to 1500 Å.

A core LDD implant is then performed into the exposed portions of the substrate 10/core N-well 24 to form:

a) LDD implants 54 within substrate 10 adjacent poly gate/core poly gate 32 within core area 12;

b) LDD implant 58 within substrate 10 within bit line contact area/junction 45; and c) respective LDD implants 56 within substrate 10 within the exposed portions 51, 53 of respective node junctions 47, 49.

The core LDD implant process is conducted perpendicular to the surface of the substrate 10 to form the core PLDD implant The core PLDD implant employs a P-type dosage such as boron (B) and $BF_2$. The P-type core LDD implants are conducted to a concentration of preferably from about $1 \times 10^{14}$ to $5 \times 10^{14}$ atoms/cm$^2$ and more preferably from about $2 \times 10^{14}$ to $4 \times 10^{16}$ atoms/cm$^2$ and at an energy of from about 2 to 5 keV to respective depths within substrate 10/core N-well 24 of preferably from about 300 to 800 Å and more preferably from about 400 to 600 Å.

Then, while rotating and tilting the substrate 10, an N-type pocket implant 60 employing an N-type dosage such as As and P and is conducted into:

a) the core area 12 adjacent poly gate/core poly gate 32; and b) the bit line contact area/junction 45 within the 1T RAM cell area 14. Because of the narrowness of exposed portions 51, 53 within respective node junctions 47, 49, a shadowing effect of the respective adjacent plate 36/word line 40 and plate 38/word line 42 and the fact that the pocket implant process is conducted with a tilt to the substrate 10, there are no pocket implants within the respective exposed portions 51, 53 within the respective node junctions 47, 49.

The substrate 10 is tilted preferably from about 15 to 30° relative to the direction of the pocket implant 60. The pocket implant 60 is conducted to a concentration of preferably from about $1 \times 10^{13}$ to $5 \times 10^{13}$ atoms/cm$^2$ and more preferably from about $2 \times 10^{13}$ to $4 \times 10^{13}$ atoms/cm$^2$ to a depth of preferably from about 500 to 1000 Å and more preferably from about 700 to 1000 Å.

Pocket implants 54, 56, 58 are N-type implants and are conducted to a concentration of preferably from about $1 \times 10^{13}$ to $5 \times 10^{13}$ atoms/cm$^2$ at an energy of from about 100 to 150 keV for either As or phosphorous dopant sources. The concentration of the pocket implants 54, 56, 58 is greater than the concentration of the LDD implants.

I/O Implants 70, 72

Figure 4:
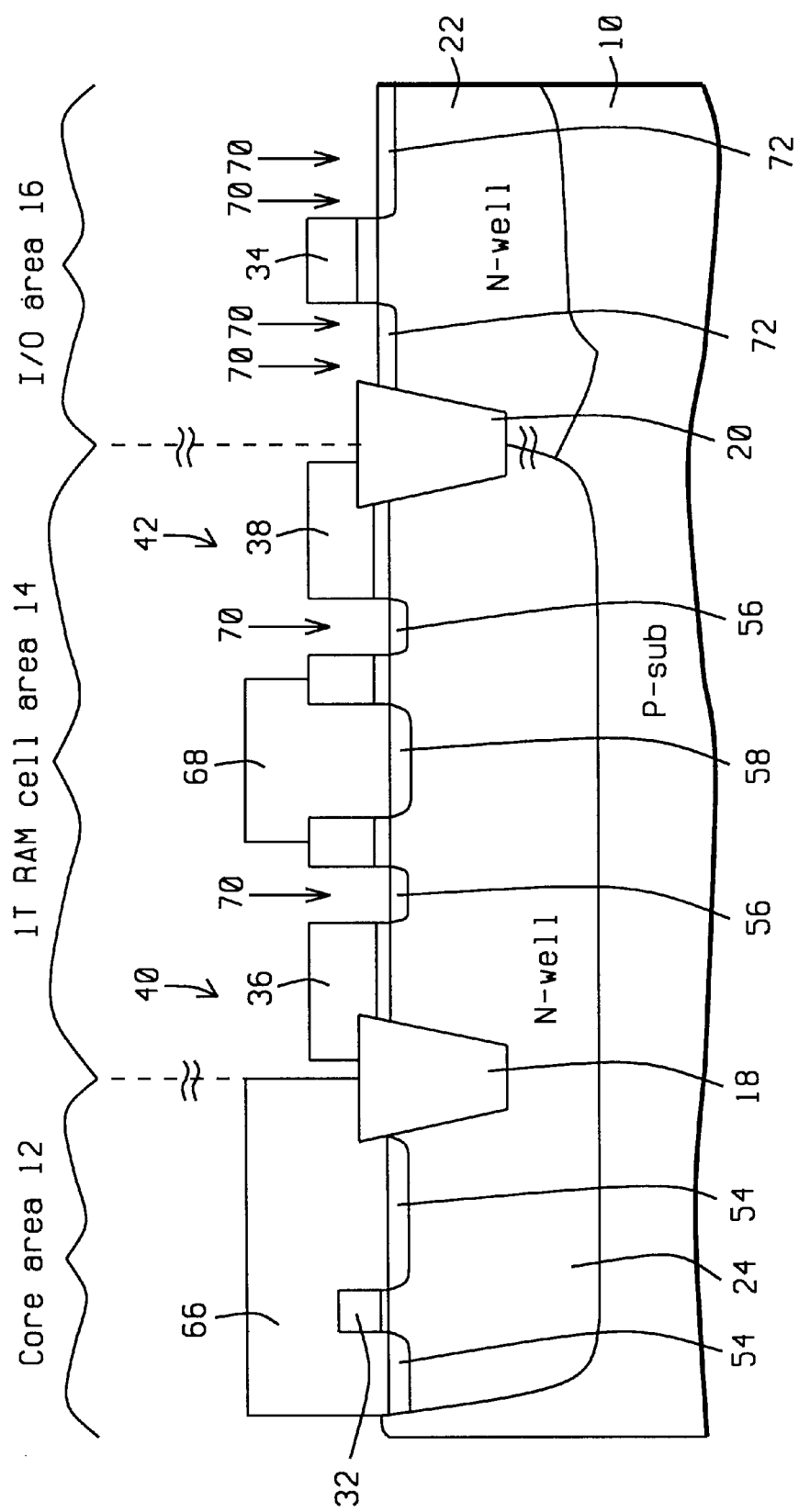

As shown in FIG. 4, the core PLDD masks 50, 52 are removed and I/O PLDD masks 66, 68 are formed over the structure to expose only:

a) I/O area 16 including poly gate 34; and b) 1T RAM cell area 14 including node junctions 47, 49 and capacitor plates 36, 38.

An I/O implant 70 is then performed into the exposed portions of the substrate 10 to form LDD implants 72 into substrate 10 adjacent poly gate 34 within I/O area 16, and adds to the LDD implant 56. The I/O LDD implant 70 process is conducted perpendicular to the surface of the substrate 10.

The I/O LDD implant 70 is a P-type implants and is conducted to a concentration of preferably from about $1 \times 10^{13}$ to $5 \times 10^{13}$ atoms/cm$^2$ and more preferably from about $2 \times 10^{13}$ to $4 \times 10^{13}$ atoms/cm$^2$ at an energy of preferably from about 25 to 35 keV for a $BF_2$ dopant source and to respective depths within substrate 10/core N-well 24 of preferably from about 1000 to 3000 Å and more preferably from about 2000 to 4000 Å.

Formation of: Sidewall Spacers 80, 82, 84, 86, 88, 90; S/D Implants 100, 102, 104; and Silicide Portions The I/O PLDD masks 66, 68 are removed.

Figure 5:
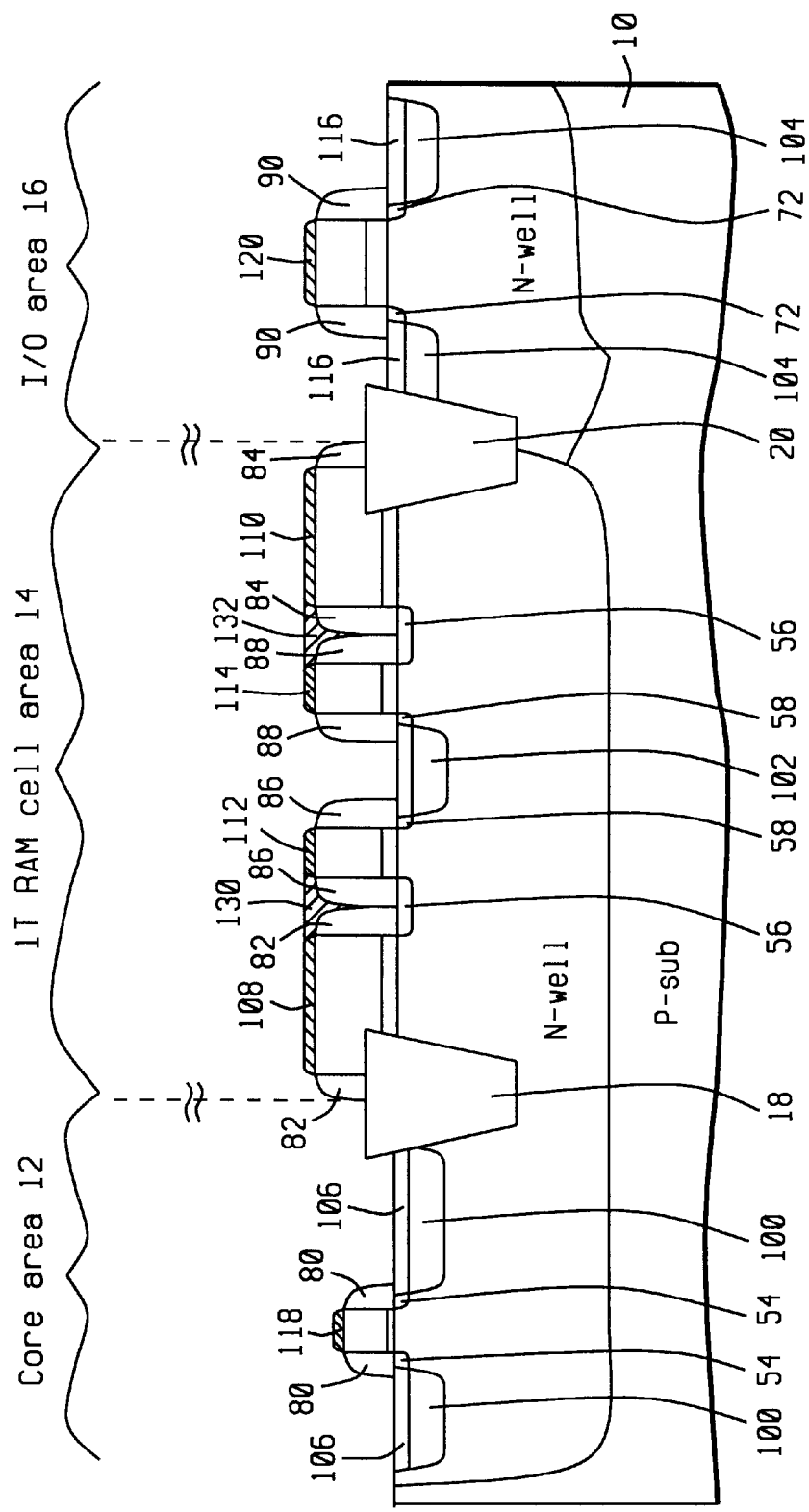

As shown in FIG. 5, sidewall spacers 80, 82, 84, 86, 88, 90 are then formed over the respective exposed sidewalls of: poly gate/core poly gate 32 within core area 12; the pair of capacitor plates 36, 38 within 1T RAM cell area 14; the pair of word lines 40, 42 within 1T RAM cell area 14; and the poly gate 34 within the I/O area 16. Sidewall spacers 80, 82, 84, 86, 88, 90 are preferably comprised of nitride, silicon nitride, silicon oxide, silicon oxynitride or composite oxide/ nitride/oxide and are more preferably composite oxide/ nitride/oxide.

The respective facing, adjoining sidewall spacers 82/86 and 84/88 of the adjacent capacitor plate 36/word line 40 and the adjacent capacitor plate 38/word line 42 merge/nearly merge. Blocking portions 130, 132 may be formed over the respective facing, adjoining sidewall spacers 82/86 and 84/88 of the adjacent capacitor plate 36/word line 40 and the adjacent capacitor plate 38/word line 42. Blocking portions 130, 132 are preferably comprised of resist protect oxide (RPO), silicon oxide or nitride and are more preferably RPO. RPO blocking portions 130, 132 are to ensure that no silicon surface may be exposed at the storage node area as the silicide formation occurs.

Source/drain (S/D) implants 100, 102, 104 are then conducted into substrate 10: a) adjacent the sidewall spacers 80 of the poly gate/pass gate 32 within the core area 12; adjacent the sidewall spacers 86, 88 within the bit line contact area/junction 45 within the 1T RAM cell area 14; and adjacent the sidewall spacers 90 of the poly gate 34 within the I/O area 16. The S/D implants 100, 102, 104 are implanted at a concentration of preferably from about $1\times10^{15}$ to $5\times10^{15}$ atoms/cm$^2$ and more preferably from about $2\times10^{15}$ to $4\times10^{15}$ atoms/cm$^2$ at an energy of from about 5 to 10 keV for a boron dopant source to respective depths within substrate 10 of preferably from about 3000 to 8000 Å and more preferably from about 5000 to 7000.

A metal layer is then formed over the structure and the structure is heated to form silicide structures 106, 108, 110, 112, 114, 116, 118, 120, 122 over the exposed polysilicon/silicon areas, i.e. respectively, S/D implants 100, capacitor plate 36, capacitor plate 38, word line 40, word line 41, S/D implants 104, poly gate/core poly gate 32, poly gate 34, S/D implant 102 within the bit line contact area/junction 45. The silicide structures 106, 108, 110, 112, 114, 116, 118, 120, 122 are preferably formed of Co-silicide or Ti-silicide and are more preferably Co-silicide. Silicide structures 106, 108, 110, 112, 114, 116, 118, 120, 122 are preferably formed to a thickness of from about 100 to 300 Å and more preferably from about 100 to 200 Å.

It is noted that because of the merged/nearly merged adjoining sidewall spacers 82/86 and 84/88 of the adjacent capacitor plate 36/word line 40 and the adjacent capacitor plate 38/word line 42 and/or the blocking portions 130, 132 over the merged/nearly merged adjoining sidewall spacers 82/86 and 84/88 of the adjacent capacitor plate 36/word line 40 and the adjacent capacitor plate 38/word line 42 no S/D implants or silicide portions are formed within the node junctions 47, 49.

Advantages of the Present Invention

The advantages of one or more embodiments of the present invention include:

1. formation of an asymmetric LDD structure for a high performance pass gate device without adding further masks;
2. improvement of storage node junction leakage due to the absence of both a P+ S/D implant and, a pocket implant in the storage nodes which also improves the refresh time of the 1T RAM;
3. improvement of storage node junction leakage because of the lack of silicide formation in the storage node junction area which also improves the refresh time of the 1T RAM; and
4. the refresh time of the 1T RAM is improved because of: a) a 20 to 32 Å gate oxide (gox) for the capacitor and pass gate that reduces gox tunneling current; and b) an asymmetric LDD structure that improves the pass gate performance.

While particular embodiments of the present invention have been illustrated and described, it is not intended to limit the invention, except as defined by the following claims.

We claim:

1. A method of fabricating a 1T RAM, comprising the steps of:
   providing a substrate having a core area, a 1T RAM cell area and an I/O area;
   forming a first poly gate over the substrate within the core area; the first poly gate having exposed side walls;
   forming respective pairs of capacitor plates and adjacent word lines over the substrate within the 1T RAM cell area to form node junctions between the respective capacitor plates and adjacent word lines and a bit line contact junction between the word lines; the capacitor plates and the word lines each having exposed side walls;
   forming a second poly gate over the substrate within the I/O area; the second poly gate having exposed side walls; forming first patterned masks over the substrate to expose: the core area; the bit line contact junction; and portions of the node junctions adjacent the word lines;
   performing a first implantation;
   performing a tilt implantation;
   removing the first patterned masks;
   forming second patterned masks over the substrate to expose: the I/O area and the 1T RAM cell area not within the bit line contact junction;
   performing a second implantation;
   forming sidewall spacers so that the adjacent sidewall spacers between the respective pairs of capacitor plates and word lines being nearly merged; and
   performing a third implantation.

2. The method of claim 1, including the steps of:
   forming a first isolation structure within the substrate separating the core area from the 1T RAM cell area; and
   forming a second isolation structure within the substrate separating the 1T RAM cell area 14 from the I/O area.

3. The method of claim 1, including the steps of:
   forming an I/O N-well within the substrate within the I/O area; and
   forming a core N-well within the substrate within the core and 1T RAM cell areas.

4. The method of claim 1, including the step of:
   forming a triple gate oxide upon the substrate wherein the thinnest gate oxide layer is formed within the core area, the middle thickness gate oxide layer is formed within the 1T RAM cell area and the thickest gate oxide layer is formed within the I/O area.

5. The method of claim 1, including the step of:
   forming a triple gate oxide upon the substrate wherein the gate oxide layer formed within the core area has a thickness of less than about 20 Å, the middle thickness gate oxide layer formed within the 1T RAM cell area has a thickness of from about 20 to 32 Å and the thickest gate oxide layer formed within the I/O area has a thickness of greater than about 32 Å.

6. The method of claim 1, including the step of:
   forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 32 to 120 Å.

7. The method of claim 1, including the step of:
forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 50 to 70 Å.

8. The method of claim 1, wherein the portions of the node junctions adjacent the word lines exposed by the core PLDD masks each have a width of from about 900 to 2000 Å.

9. The method of claim 1, wherein the portions of the node junctions adjacent the word lines exposed by the core PLDD masks each have a width of from about 900 to 1500 Å.

10. The method of claim 1, wherein the core and I/O LDD implants are each a P-type implant.

11. The method of claim 1, wherein the core LDD implant is conducted to a concentration of preferably from about $1 \times 10^{14}$ to $5 \times 10^{14}$ atoms/cm$^2$ and to a depth of from about 300 to 800 Å.

12. The method of claim 1, wherein the core LDD implant is conducted to a concentration of preferably from about $2 \times 10^{14}$ to $4 \times 10^{16}$ atoms/cm$^2$ and to a depth of from about 400 to 600 Å.

13. The method of claim 1, wherein the core LDD implant is conducted at an energy of from about 2 to 5 keV.

14. The method of claim 1, wherein the I/O LDD implant is conducted to a concentration of preferably from about $1 \times 10^{13}$ to $5 \times 10^{13}$ atoms/cm$^2$ and to a depth of from about 1000 to 3000 Å.

15. The method of claim 1, wherein the I/O LDD implant is conducted to a concentration of preferably from about $2 \times 10^{13}$ to $4 \times 10^{13}$ atoms/cm$^2$ and to a depth of from about 2000 to 4000 Å.

16. The method of claim 1, wherein the tilt pocket implant is conducted at an angle of from about 15 to 30° relative to the surface of the substrate.

17. The method of claim 1, wherein the tilt pocket implant is an N-type implant.

18. The method of claim 1, wherein the tilt pocket implant is conducted to a concentration of preferably from about $1 \times 10^{13}$ to $5 \times 10^{13}$ atoms/cm$^2$ and to a depth of from about 500 to 1000 Å.

19. The method of claim 1, wherein the tilt pocket implant is conducted to a concentration of preferably from about $2 \times 10^{13}$ to $4 \times 10^{13}$ atoms/cm$^2$ and to a depth of from about 700 to 1000 Å.

20. The method of claim 1, wherein the sidewall spacers are comprised of a material selected from the group consisting of nitride, silicon nitride, silicon oxide, silicon oxynitride and composite oxide/nitride/oxide.

21. The method of claim 1, wherein the sidewall spacers are comprised of composite oxide/nitride/oxide.

22. The method of claim 1, wherein blocking portions are formed over the nearly merged adjacent sidewall spacers between the respective pairs of capacitor plates and word lines.

23. The method of claim 1, wherein blocking portions are formed over the nearly merged adjacent sidewall spacers between the respective pairs of capacitor plates and word lines; the blocking portions being comprised of a material selected from the group consisting of resist protect oxide, silicon oxide and nitride.

24. The method of claim 1, wherein blocking portions are formed over the nearly merged adjacent sidewall spacers between the respective pairs of capacitor plates and word lines; the blocking portions being comprised of resist protect oxide.

25. The method of claim 1, wherein the source/drain implants are conducted to a concentration of preferably from about $1 \times 10^{15}$ to $5 \times 10^{15}$ atoms/cm$^2$ and to a depth of from about 3000 to 8000 Å.

26. The method of claim 1, wherein the source/drain implants are conducted to a concentration of preferably from about $2 \times 10^{15}$ to $4 \times 10^{15}$ atoms/cm$^2$ and to a depth of from about 5000 to 7000 Å.

27. The method of claim 1, wherein the source/drain implants are conducted at an energy of from about 5 to 10 keV.

28. The method of claim 1, wherein the silicide structures are formed of a material selected from the group consisting of Co-silicide and Ti-silicide.

29. The method of claim 1, wherein the silicide structures are formed of Co-silicide.

30. The method of claim 1, wherein the first implantation is a core LDD implant performed to form LDD implants adjacent the first poly gate, an LDD implant within the bit line contact junction and LDD implants within the exposed portions of the node junctions.

31. The method of claim 1, wherein the tilt implantation is a pocket implant into the substrate to form pocket implants adjacent the first poly gate and within the bit line contact junction.

32. The method of claim 1, wherein the second implantation is an I/O implant performed into the substrate within the node junctions to form LDD implants adjacent the second poly gate.

33. The method of claim 1, wherein the third implantation is a source/drain implantation performed into the substrate adjacent the respective sidewall spacers of the first and second poly gates; and adjacent the sidewall spacers of the adjacent word lines within the bit line contact area/junction.

34. The method of claim 1, including the step of forming silicide structures over: the first and second poly gates; the capacitor plates; the word lines; and the source/drain implants.

35. A method of fabricating a 1T RAM, comprising the steps of:
providing a substrate having a core area, a 1T RAM cell area and an I/O area;
forming a first poly gate over the substrate within the core area; the first poly gate having exposed side walls;
forming respective pairs of capacitor plates and adjacent word lines over the substrate within the 1T RAM cell area to form node junctions between the respective capacitor plates and adjacent word lines and a bit line contact junction between the word lines; the capacitor plates and the word lines each having exposed side walls;
forming a second poly gate over the substrate within the I/O area; the second poly gate having exposed side walls;
forming core PLDD masks over the substrate to expose only: the core area; the bit line contact junction; and portions of the node junctions adjacent the word lines;
performing a core LDD implant into the substrate to form LDD implants adjacent the first poly gate, an LDD implant within the bit line contact junction and LDD implants within the exposed portions of the node junctions;
performing a tilt pocket implant into the substrate to form pocket implants adjacent the first poly gate and within the bit line contact junction;

removing the core PLDD masks;

forming I/O PLDD masks over the substrate to expose only: the I/O area and the 1T RAM cell area not within the bit line contact junction;

performing an I/O implant into the substrate within the node junctions and to form LDD implants adjacent the second poly gate;

forming sidewall spacers over the exposed side walls of the first and second poly gates, the capacitor plates and the word lines so that the adjacent sidewall spacers between the respective pairs of capacitor plates and word lines being nearly merged;

performing source/drain implants into the substrate adjacent the respective sidewall spacers of the first and second poly gates; and adjacent the sidewall spacers of the adjacent word lines within the bit line contact area/junction; and forming silicide structures over: the first and second poly gates; the capacitor plates; the word lines; and the source/drain implants.

36. The method of claim 35, including the steps of:

forming a first isolation structure within the substrate separating the core area from the 1T RAM cell area; and forming a second isolation structure within the substrate separating the 1T RAM cell area 14 from the I/O area.

37. The method of claim 35, including the steps of:

forming an I/O N-well within the substrate within the I/O area; and forming a core N-well within the substrate within the core and 1T RAM cell areas.

38. The method of claim 35, including the step of:

forming a triple gate oxide upon the substrate wherein the thinnest gate oxide layer is formed within the core area, the middle thickness gate oxide layer is formed within the 1T RAM cell area and the thickest gate oxide layer is formed within the I/O area.

39. The method of claim 35, including the step of:

forming a triple gate oxide upon the substrate wherein the gate oxide layer formed within the core area has a thickness of less than about 20 Å, the middle thickness gate oxide layer formed within the 1T RAM cell area has a thickness of from about 20 to 32 Å and the thickest gate oxide layer formed within the I/O area has a thickness of greater than about 32 Å.

40. The method of claim 35, including the step of:

forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 32 to 120 Å.

41. The method of claim 35, including the step of:

forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 50 to 70 Å.

42. The method of claim 35, wherein the portions of the node junctions adjacent the word lines exposed by the core PLDD masks each have a width of from about 900 to 2000 Å.

43. The method of claim 35, wherein the portions of the node junctions adjacent the word lines exposed by the core PLDD masks each have a width of from about 900 to 1500 Å.

44. The method of claim 35, wherein the core and I/O LDD implants are each a P-type implant.

45. The method of claim 35, wherein the core LDD implant is conducted to a concentration of preferably from about $1\times10^{14}$ to $5\times10^{14}$ atoms/cm$^2$ and to a depth of from about 300 to 800 Å.

46. The method of claim 35, wherein the core LDD implant is conducted to a concentration of preferably from about $2\times10^{14}$ to $4\times10^{16}$ atoms/cm$^2$ and to a depth of from about 400 to 600 Å.

47. The method of claim 35, wherein the core LDD implant is conducted at an energy of from about 2 to 5 keV.

48. The method of claim 35, wherein the I/O LDD implant is conducted to a concentration of preferably from about $1\times10^{13}$ to $5\times10^{13}$ atoms/cm$^2$ and to a depth of from about 1000 to 3000 Å.

49. The method of claim 35, wherein the I/O LDD implant is conducted to a concentration of preferably from about $2\times10^{13}$ to $4\times10^{13}$ atoms/cm$^2$ and to a depth of from about 2000 to 4000 Å.

50. The method of claim 35, wherein the tilt pocket implant is conducted at an angle of from about 15 to 30° relative to the surface of the substrate.

51. The method of claim 35, wherein the tilt pocket implant is an N-type implant.

52. The method of claim 35, wherein the tilt pocket implant is conducted to a concentration of preferably from about $1\times10^{13}$ to $5\times10^{13}$ atoms/cm$^2$ and to a depth of from about 500 to 1000 Å.

53. The method of claim 35, wherein the tilt pocket implant is conducted to a concentration of preferably from about $2\times10^{13}$ to $4\times10^{13}$ atoms/cm$^2$ and to a depth of from about 700 to 1000 Å.

54. The method of claim 35, wherein the sidewall spacers are comprised of a material selected from the group consisting of nitride, silicon nitride, silicon oxide, silicon oxynitride and composite oxide/nitride/oxide.

55. The method of claim 35, wherein the sidewall spacers are comprised of composite oxide/nitride/oxide.

56. The method of claim 35, wherein blocking portions are formed over the nearly merged adjacent sidewall spacers between the respective pairs of capacitor plates and word lines.

57. The method of claim 35, wherein blocking portions are formed over the nearly merged adjacent sidewall spacers between the respective pairs of capacitor plates and word lines; the blocking portions being comprised of a material selected from the group consisting of resist protect oxide, silicon oxide and nitride.

58. The method of claim 35, wherein blocking portions are formed over the nearly merged adjacent sidewall spacers between the respective pairs of capacitor plates and word lines; the blocking portions being comprised of resist protect oxide.

59. The method of claim 35, wherein the source/drain implants are conducted to a concentration of preferably from about $1\times10^{15}$ to $5\times10^{15}$ atoms/cm$^2$ and to a depth of from about 3000 to 8000 Å.

60. The method of claim 35, wherein the source/drain implants are conducted to a concentration of preferably from about $2\times10^{15}$ to $4\times10^{15}$ atoms/cm$^2$ and to a depth of from about 5000 to 7000 Å.

61. The method of claim 35, wherein the source/drain implants are conducted at an energy of from about 5 to 10 keV.

62. The method of claim 35, wherein the silicide structures are formed of a material selected from the group consisting of Co-silicide and Ti-silicide.

63. The method of claim 35, wherein the silicide structures are formed of Co-silicide.

64. A method of fabricating a 1T RAM, comprising the steps of:
providing a substrate having a core area, a 1T RAM cell area and an I/O area;
forming a first poly gate over the substrate within the core area; the first poly gate having exposed side walls;
forming respective pairs of capacitor plates and adjacent word lines over the substrate within the 1T RAM cell area to form node junctions between the respective capacitor plates and adjacent word lines and a bit line contact junction between the word lines; the capacitor plates and the word lines each having exposed side walls;
forming a second poly gate over the substrate within the I/O area; the second poly gate having exposed side walls;
forming core PLDD masks over the substrate to expose only: the core area; the bit line contact junction; and portions of the node junctions adjacent the word lines;
performing a P-type core LDD implant into the substrate at an energy of from about 2 to 5 keV to form LDD implants adjacent the first poly gate, an LDD implant within the bit line contact junction and LDD implants within the exposed portions of the node junctions;
performing a tilt pocket implant into the substrate to form pocket implants adjacent the first poly gate and within the bit line contact junction;
removing the core PLDD masks;
forming I/O PLDD masks over the substrate to expose only: the I/O area and the 1T RAM cell area not within the bit line contact junction;
performing an P-type I/O implant into the substrate within the node junctions and to form LDD implants adjacent the second poly gate;
forming sidewall spacers over the exposed side walls of the first and second poly gates, the capacitor plates and the word lines so that the adjacent sidewall spacers between the respective pairs of capacitor plates and word lines being nearly merged;
performing source/drain implants into the substrate at an energy of from about 5 to 10 keV adjacent the respective sidewall spacers of the first and second poly gates; and adjacent the sidewall spacers of the adjacent word lines within the bit line contact area/junction; and
forming silicide structures over: the first and second poly gates; the capacitor plates; the word lines; and the source/drain implants.

65. The method of claim 64, including the steps of:
forming a first isolation structure within the substrate separating the core area from the 1T RAM cell area; and
forming a second isolation structure within the substrate separating the 1T RAM cell area 14 from the I/O area.

66. The method of claim 64, including the steps of:
forming an I/O N-well within the substrate within the I/O area; and
forming a core N-well within the substrate within the core and 1T RAM cell areas.

67. The method of claim 64, including the step of:
forming a triple gate oxide upon the substrate wherein the thinnest gate oxide layer is formed within the core area, the middle thickness gate oxide layer is formed within the 1T RAM cell area and the thickest gate oxide layer is formed within the I/O area.

68. The method of claim 64, including the step of:
forming a triple gate oxide upon the substrate wherein the gate oxide layer formed within the core area has a thickness of less than about 20 Å, the middle thickness gate oxide layer formed within the 1T RAM cell area has a thickness of from about 20 to 32 Å and the thickest gate oxide layer formed within the I/O area has a thickness of greater than about 32 Å.

69. The method of claim 64, including the step of:
forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 32 to 120 Å.

70. The method of claim 64, including the step of:
forming a triple gate oxide upon the substrate wherein the gate oxide layer formed within the core area has a thickness of from about 15 to 20 Å, the middle thickness gate oxide layer formed within the 1T RAM cell area 14 has a thickness of from about 24 to 28 Å and the thickest gate oxide layer formed within the I/O area has a thickness of from about 50 to 70 Å.

71. The method of claim 64, wherein the portions of the node junctions adjacent the word lines exposed by the core PLDD masks each have a width of from about 900 to 2000 Å.

72. The method of claim 64, wherein the portions of the node junctions adjacent the word lines exposed by the core PLDD masks each have a width of from about 900 to 1500 Å.

73. The method of claim 64, wherein the core LDD implant is conducted to a concentration of preferably from about $1 \times 10^{14}$ to $5 \times 10^{14}$ atoms/cm$^2$ and to a depth of from about 300 to 800 Å.

74. The method of claim 64, wherein the core LDD implant is conducted to a concentration of preferably from about $2 \times 10^{14}$ to $4 \times 10^{16}$ atoms/cm$^2$ and to a depth of from about 400 to 600 Å.

75. The method of claim 64, wherein the I/O LDD implant is conducted to a concentration of preferably from about $1 \times 10^{13}$ to $5 \times 10^{13}$ atoms/cm$^2$ and to a depth of from about 1000 to 3000 Å.

76. The method of claim 64, wherein the I/O LDD implant is conducted to a concentration of preferably from about $2 \times 10^{13}$ to $4 \times 10^{13}$ atoms/cm$^2$ and to a depth of from about 2000 to 4000 Å.

77. The method of claim 64, wherein the tilt pocket implant is conducted at an angle of from about 15 to 30° relative to the surface of the substrate.

78. The method of claim 64, wherein the tilt pocket implant is an N-type implant.

79. The method of claim 64, wherein the tilt pocket implant is conducted to a concentration of preferably from about $1 \times 10^{13}$ to $5 \times 10^{13}$ atoms/cm$^2$ and to a depth of from about 500 to 1000 Å.

80. The method of claim 64, wherein the tilt pocket implant is conducted to a concentration of preferably from about $2 \times 10^{13}$ to $4 \times 10^{13}$ atoms/cm$^2$ and to a depth of from about 700 to 1000 Å.

81. The method of claim 64, wherein the sidewall spacers are comprised of a material selected from the group consisting of nitride, silicon nitride, silicon oxide, silicon oxynitride and composite oxide/nitride/oxide.

82. The method of claim 64, wherein the sidewall spacers are comprised of composite oxide/nitride/oxide.

83. The method of claim 64, wherein blocking portions are formed over the nearly merged adjacent sidewall spacers between the respective pairs of capacitor plates and word lines.

84. The method of claim 64, wherein blocking portions are formed over the nearly merged adjacent sidewall spacers between the respective pairs of capacitor plates and word lines; the blocking portions being comprised of a material selected from the group consisting of resist protect oxide, silicon oxide and nitride.

85. The method of claim 64, wherein blocking portions are formed over the nearly merged adjacent sidewall spacers between the respective pairs of capacitor plates and word lines; the blocking portions being comprised of resist protect oxide.

86. The method of claim 64, wherein the source/drain implants are conducted to a concentration of preferably from about $1\times10^{15}$ to $5\times10^{15}$ atoms/cm$^2$ and to a depth of from about 3000 to 8000 Å.

87. The method of claim 64, wherein the source/drain implants are conducted to a concentration of preferably from about $2\times10^{15}$ to $4\times10^{15}$ atoms/cm$^2$ and to a depth of from about 5000 to 7000 Å.

88. The method of claim 64, wherein the silicide structures are formed of a material selected from the group consisting of Co-silicide and Ti-silicide.

89. The method of claim 64, wherein the silicide structures are formed of Co-silicide.

* * * * *